United States Patent
Moore et al.

(10) Patent No.: US 7,507,034 B2
(45) Date of Patent: Mar. 24, 2009

(54) PRINTED CIRCUIT BOARD POSITIONING MECHANISM

(75) Inventors: Joshua Moore, Sunnyvale, CA (US); Hung Van Nguyen, San Jose, CA (US); Stephen Nelson, Santa Clara, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/038,708

(22) Filed: Feb. 27, 2008

(65) Prior Publication Data
US 2008/0205827 A1    Aug. 28, 2008

Related U.S. Application Data

(60) Provisional application No. 60/944,043, filed on Jun. 14, 2007, provisional application No. 60/892,199, filed on Feb. 28, 2007.

(51) Int. Cl.
G02B 6/36 (2006.01)
(52) U.S. Cl. .............................. 385/88; 385/14; 385/52; 385/136
(58) Field of Classification Search ................... 385/88, 385/89, 90, 92, 134, 135, 136, 137, 14, 52
See application file for complete search history.

(56) References Cited

U.S. PATENT DOCUMENTS 4,327,482 A    5/1982    Araki et al. ................... 29/740
6,047,874 A *  4/2000    Asai et al. ..................... 226/110
6,409,159 B1 * 6/2002    Asai et al. ..................... 267/152
6,671,450 B2 * 12/2003   Khan et al. ................... 385/137
7,275,937 B2 * 10/2007   Ellison ......................... 439/67
7,306,377 B2 * 12/2007   Ellison ......................... 385/88
7,309,170 B2 * 12/2007   Ice et al. ....................... 385/88

FOREIGN PATENT DOCUMENTS

| JP | 04-250419 | 9/1992 |
|---|---|---|
| JP | 11-150154 | 6/1999 |
| KR | 10-2004-0072926 | 8/2004 |
| KR | 10-2005-0038504 | 4/2005 |

OTHER PUBLICATIONS

Moore, Joshua et al, Collar Clip for an Electronic Module, U.S. Appl. No. 12/038,689, filed Feb. 27, 2008.
Moore, Joshua et al, Positioning Plate for Optical Subassembly, U.S. Appl. No. 12/039,598, filed Feb. 28, 2008.
Moore, Joshua et al, Rotatable Top Shell, U.S. Appl. No. 12/039,677, filed Feb. 28, 2008.
Moore, Joshua, Angular Seam for an Electronic Module, U.S. Appl. No. 12/038,721, filed Feb. 27, 2008.
Moore, Joshua, Optical Subassembly Positioning Device for an Electronic Module, U.S. Appl. No. 12/038,784, filed Feb. 27, 2008.

* cited by examiner

Primary Examiner—Brian M Healy
(74) Attorney, Agent, or Firm—Workman Nydegger

(57) ABSTRACT

In one example embodiment, a printed circuit board positioning mechanism includes a solderable plate and a compressible structure attached to the solderable plate.

18 Claims, 8 Drawing Sheets

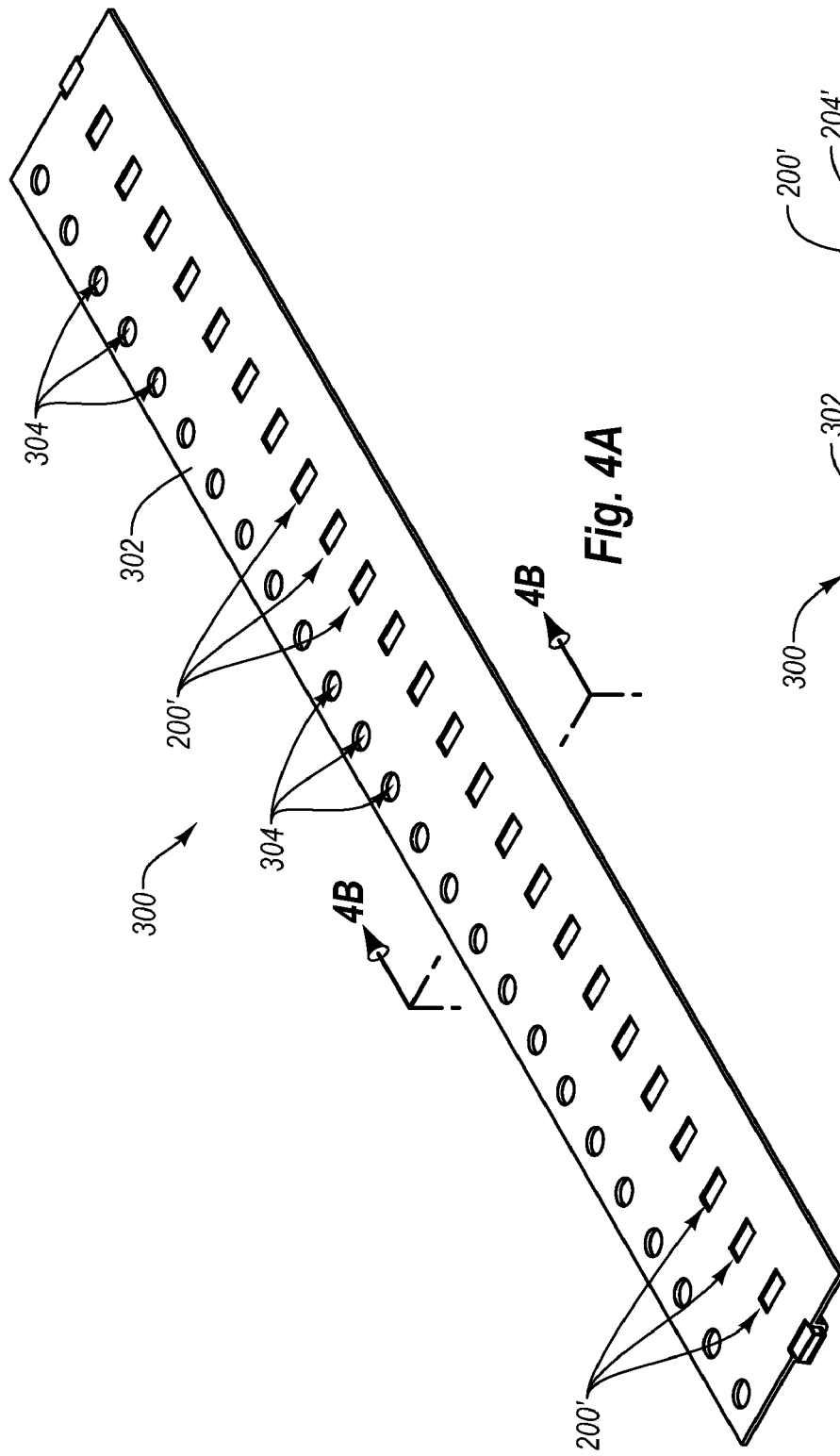
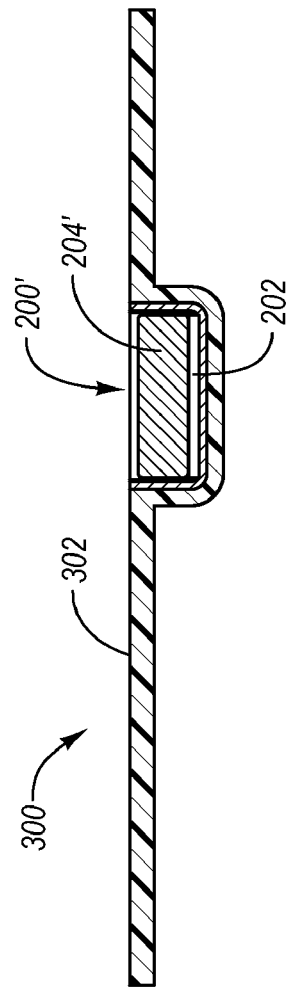

PRINTED CIRCUIT BOARD POSITIONING MECHANISM

CROSS REFERENCE TO RELATED APPLICATIONS

The present application claims priority to U.S. Provisional Patent Application Ser. No. 60/892,199, filed Feb. 28, 2007 and entitled "Electronic Module Mechanical Systems," and also claims priority to U.S. Provisional Patent Application Ser. No. 60/944,043, filed Jun. 14, 2007 and entitled "Printed Circuit Board Positioning Mechanism," each of which is incorporated herein by reference in its entirety.

BACKGROUND

Electronic modules, such as electronic or optoelectronic transceiver or transponder modules, are increasingly used in electronic and optoelectronic communication. Electronic modules typically include an internal printed circuit board (PCB) that is configured to communicate with a host device.

One common difficulty associated with the electronic modules concerns the assembly of the modules. For example, due to limitations in size and space, it can sometimes be difficult to accurately secure an internal circuit board within an electronic module. It can also be difficult to take up the tolerance variations in PCB construction. A need exists, therefore, for mechanisms that can accurately secure an internal circuit board within an electronic module.

SUMMARY OF SOME EXAMPLE EMBODIMENTS

In general, example embodiments of the invention relate to printed circuit board (PCB) positioning mechanisms that can be employed in an electronic module, such as an electronic or optoelectronic transceiver or transponder module. The example PCB positioning mechanisms disclosed herein can enable completely automated positioned and securing of a PCB within an electronic module.

In one example embodiment, a PCB positioning mechanism includes a solderable plate and a compressible structure attached to the solderable plate.

In another example embodiment, a PCB positioning system includes a PCB, and a plurality of PCB positioning mechanisms soldered to the PCB. Each of the PCB positioning mechanisms includes a solderable plate and a compressible structure attached to the solderable plate.

In yet another example embodiment, an optoelectronic transceiver module includes a multi-piece shell, a PCB at least partially positioned within the multi-piece shell, a TOSA electrically connected to the PCB, and a ROSA electrically connected to the PCB. A first piece of the multi-piece shell defines a plurality of posts. The optoelectronic transceiver module also includes a plurality of PCB positioning mechanisms soldered to the PCB. Each of the PCB positioning mechanisms includes a solderable plate and a compressible structure attached to the solderable plate. Each of the plurality of posts corresponds to one of the PCB positioning mechanisms such that when the first piece of the multi-piece shell is engaged with a second piece of the multi-piece shell, the plurality of posts compress the plurality of PCB positioning mechanisms such that the PCB is substantially secured in the y-direction within the optoelectronic transceiver module.

These and other aspects of example embodiments of the invention will become more fully apparent from the following description and appended claims.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which:

FIG. 4A is a top view of an example tape-and-reel system; and

FIG. 4B is a cross-sectional side view of the example tape-and-reel system of FIG. 4A.

DETAILED DESCRIPTION OF SOME EXAMPLE EMBODIMENTS

Example embodiments of the present invention relate to printed circuit board (PCB) positioning mechanisms that can be employed in an electronic module, such as an electronic or optoelectronic transceiver or transponder module. The example PCB positioning mechanisms disclosed herein can enable completely automated positioned and securing of a PCB within an electronic module. The example PCB positioning mechanisms disclosed herein can also eliminate the need to secure the PCB with screws or other fasteners, thus decreasing assembly cost, assembly time, and assembly complexity. The example PCB positioning mechanisms disclosed herein can also help avoid assembly problems associated with manufacturing tolerances and tolerance stacking between components of the electronic module.

Reference will now be made to the drawings to describe various aspects of some example embodiments of the invention. It is to be understood that the drawings are diagrammatic and schematic representations of such example embodiments, and are not limiting of the present invention, nor are they necessarily drawn to scale.

1. Example Optoelectronic Transceiver Module

Figure 1A:
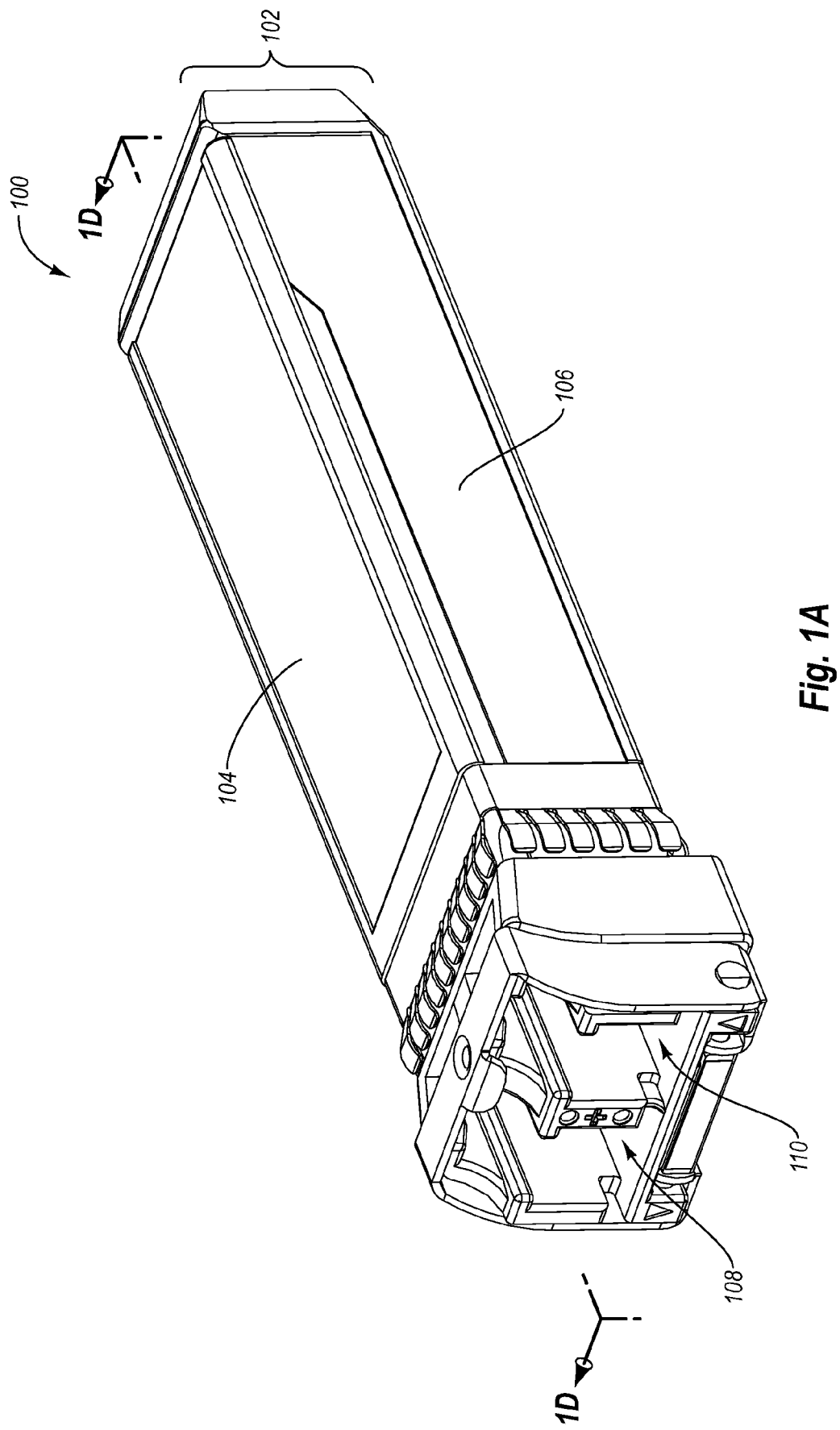
FIG. 1A is a top perspective view of an example optoelectronic transceiver module.
Figure 1B:
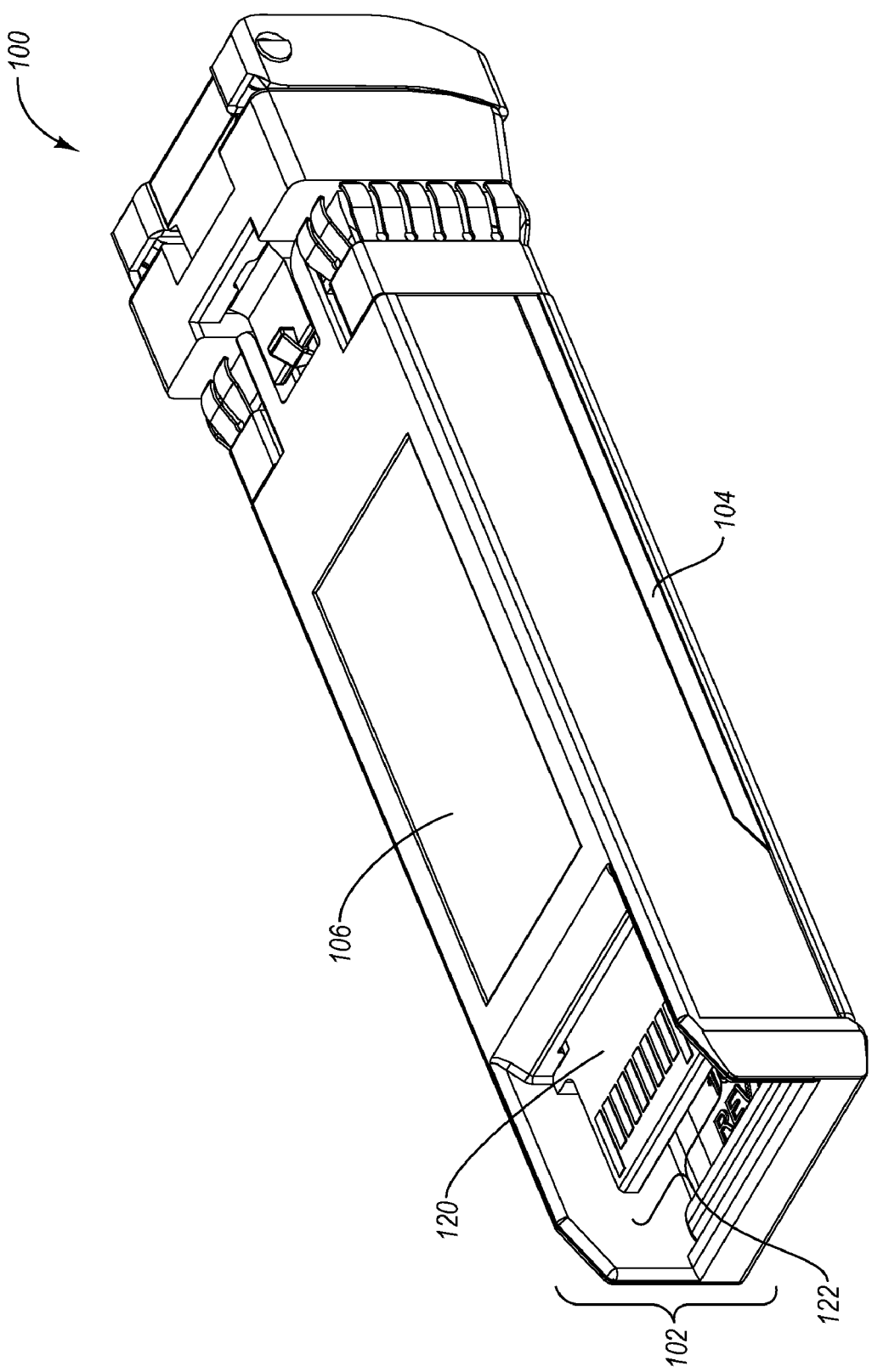
FIG. 1B is a bottom perspective view of the example optoelectronic transceiver module of FIG. 1A.
Figure 1C:
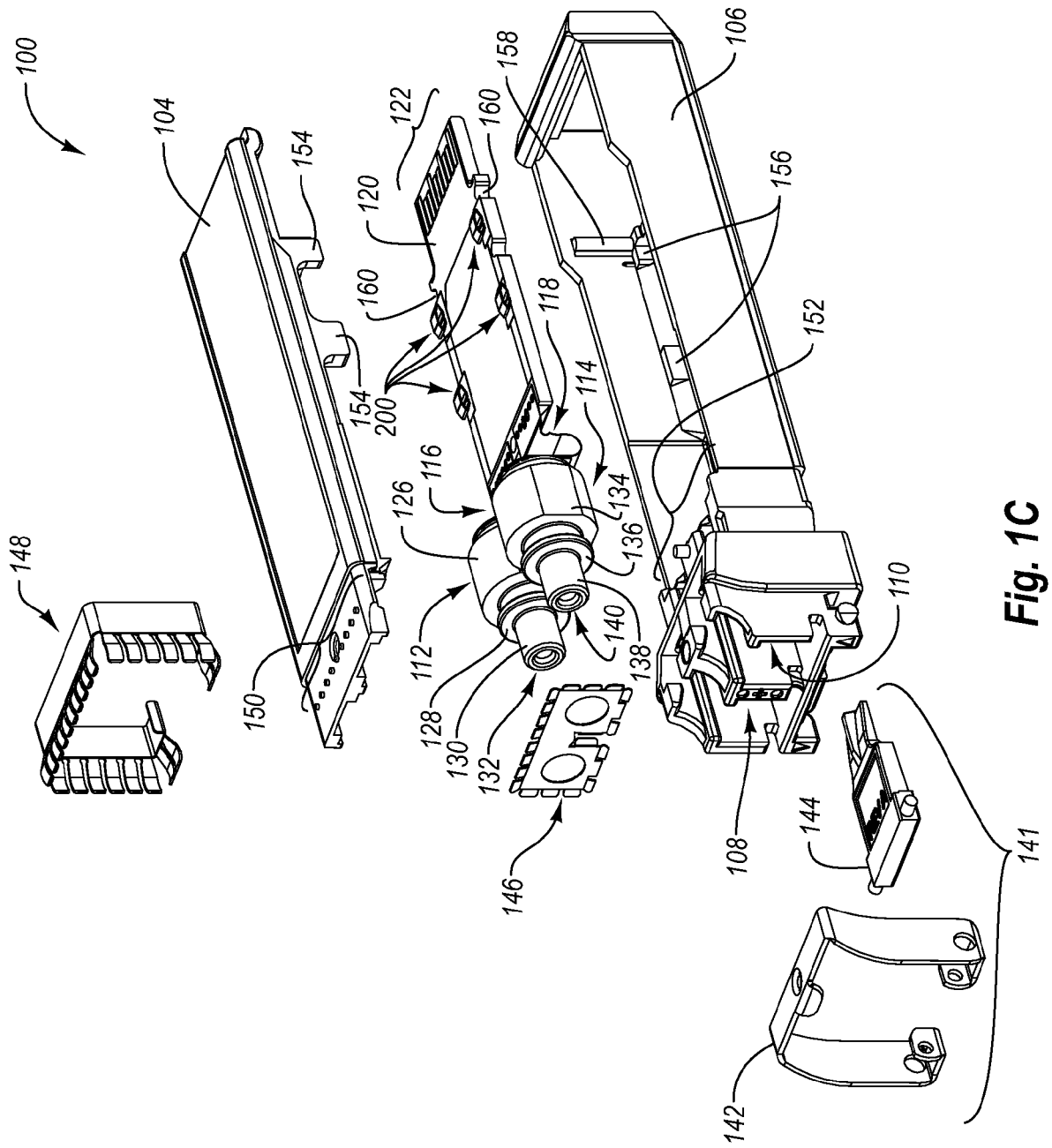
FIG. 1C is an exploded perspective view of the example optoelectronic transceiver module of FIG. 1A.

Reference is first made to FIGS. 1A-1C which disclose aspects of an example optoelectronic transceiver module 100 for use in transmitting and receiving optical signals in connection with a host device (not shown). As disclosed in FIGS. 1A and 1B, the optoelectronic transceiver module 100 includes various components, including a shell 102 that includes a rotatable top shell 104 and a bottom shell 106. The rotatable top shell 104 is rotatable with respect to the bottom shell 106. An output port 108 and an input port 110 are defined in the bottom shell 106. The rotatable top shell 104 and the bottom shell 106 can be formed using a die casting process, machining operation, or any other suitable process(es). One example material from which the rotatable top shell 104 and the bottom shell 106 can be die cast is zinc, although the rotatable top shell 104 and the bottom shell 106 may alternatively be die cast or otherwise constructed from other suitable materials such as aluminum, or any other suitable material(s).

As disclosed in FIG. 1C, the example optoelectronic transceiver module 100 also includes a transmitter optical subassembly (TOSA) 112, a receiver optical subassembly (ROSA) 114, electrical interfaces 116 and 118, and a PCB 120 having an edge connector 122. The two electrical interfaces 116 and 118 are used to electrically connect the TOSA 112 and the ROSA 114, respectively, to the PCB 120.

The TOSA 112 of the optoelectronic transceiver module 100 includes a barrel 126 within which an optical transmitter, such as a laser, (not shown) is disposed. The optical transmitter is configured to convert electrical signals received through the PCB 120 from a host device (not shown) into corresponding optical signals. The TOSA 112 also includes a flange 128 and a nose piece 130. The nose piece 130 defines a port 132. The port 132 is configured to optically connect the optical transmitter disposed within the barrel 126 with a fiber-ferrule (not shown) disposed within the output port 108.

Similarly, the ROSA 114 of the optoelectronic transceiver module 100 includes a barrel 134, a flange 136, and a nose piece 138. The nose piece 138 defines a port 140. The port 140 is configured to optically connect an optical receiver, such as a photodiode (not shown), disposed within the barrel 134 to a fiber-ferrule (not shown) disposed within the input port 110. The optical receiver is configured to convert optical signals received from the fiber-ferrule into corresponding electrical signals for transmission to a host device (not shown) through the PCB 120.

The optoelectronic transceiver module 100 can be configured for optical signal transmission and reception at a variety of per-second data rates including, but not limited to, 1 Gbit, 2 Gbit, 2.5 Gbit, 4 Gbit, 8 Gbit, 10 Gbit, 17 Gbit, 40 Gbit, 100 Gbit, or higher. Furthermore, the optoelectronic transceiver module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Further, the optoelectronic transceiver module 100 can be configured to support various communication standards including, but not limited to, Fast Ethernet, Gigabit Ethernet, 10 Gigabit Ethernet, and 1x, 2x, 4x, and 10x Fibre Channel. In addition, although one example of the optoelectronic transceiver module 100 is configured to have a form factor that is substantially compliant with the SFP+ (IPF) MSA, the optoelectronic transceiver module 100 can alternatively be configured to have a variety of different form factors that are substantially compliant with other MSAs including, but not limited to, the SFF MSA, the XFP MSA, or the SFP MSA.

With continued reference to FIG. 1C, the optoelectronic transceiver module 100 also includes a latching mechanism 141 which includes a bail 142 and a latch 144. The optoelectronic transceiver module 100 further includes an optical subassembly (OSA) positioning plate 146, a collar clip 148, an interlocking seam 150, an angular seam 152, and four PCB positioning mechanisms 200. Aspects of example embodiments of the PCB positioning mechanism 200 will be discussed in greater detail below in connection with FIGS. 1C, 1D, and 2.

2. Example PCB Positioning Mechanism

Figure 1D:
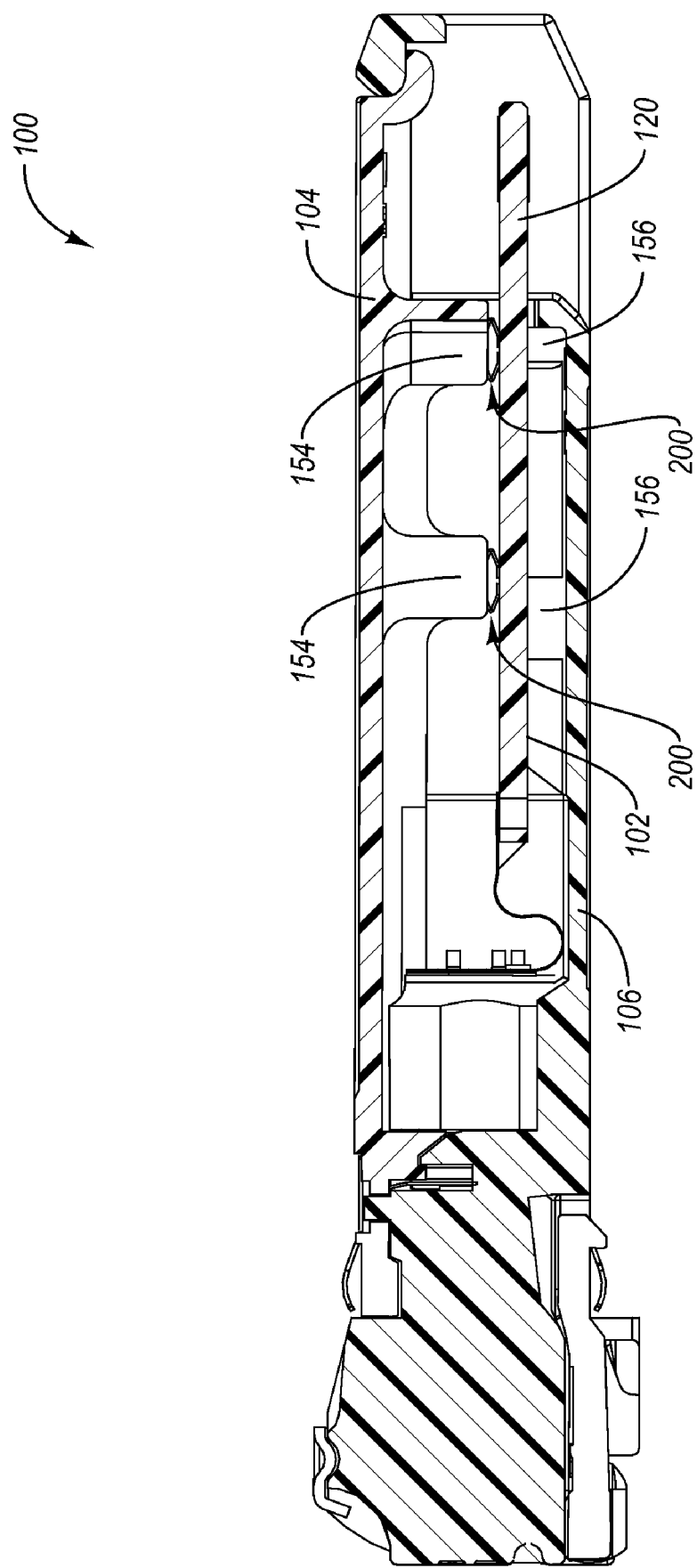
FIG. 1D is a cross-sectional side view of the example optoelectronic transceiver module of FIG. 1A.

With continuing reference to FIG. 1C, and with reference now also to FIG. 1D, aspects of the example PCB positioning mechanisms 200 are disclosed. As disclosed in FIG. 1C, four example PCB positioning mechanisms 200 are soldered to the PCB 120 and four posts 154 are formed in the rotatable top shell 104 of the optoelectronic transceiver module 100 (only two of which are viewable in FIG. 1C). As disclosed in FIG. 1C, each of the posts 154 corresponds to one of the example PCB positioning mechanisms 200. Also disclosed in FIG. 1C are four shelf structures 156 defined in the bottom of the bottom shell 106 (only two of which are viewable in FIG. 1C).

With reference now to FIG. 1D, the optoelectronic transceiver module 100 is disclosed after the top shell 104 has been rotated and closed on the bottom shell 106 during the assembly of the optoelectronic transceiver module 100. As disclosed in FIG. 1D, as the posts 154 compress the PCB positioning mechanisms 200, the PCB positioning mechanisms 200 bias the PCB 120 against the shelf structures 156 such that the PCB 120 is secured in the y-direction within the optoelectronic transceiver module 100. As the PCB positioning mechanisms 200 are compressible, the PCB positioning mechanisms 200 can take up tolerance variation in the PCB 120. The PCB positioning mechanisms 200 can also eliminate the need for screws or other fasteners when securing the PCB 120 in the bottom shell 106. The PCB positioning mechanisms 200 can therefore enable quick installation of the PCB 120 into the optoelectronic transceiver module 100, as well as the quick extraction of the PCB 120 from the optoelectronic transceiver module 100.

As disclosed in FIG. 1C, the bottom shell 106 can also include a pair of half-posts 158 defined in the wall of the bottom shell 106 that are configured to engage a pair of grooves 160 formed in the PCB 120. As disclosed in FIG. 1D, when the PCB 120 is positioned within the bottom shell 106, the engagement of the half-posts 158 with the grooves 160 aid in the securement of the PCB in an x-direction and a z-direction within the optoelectronic transceiver module 100.

Figure 2:
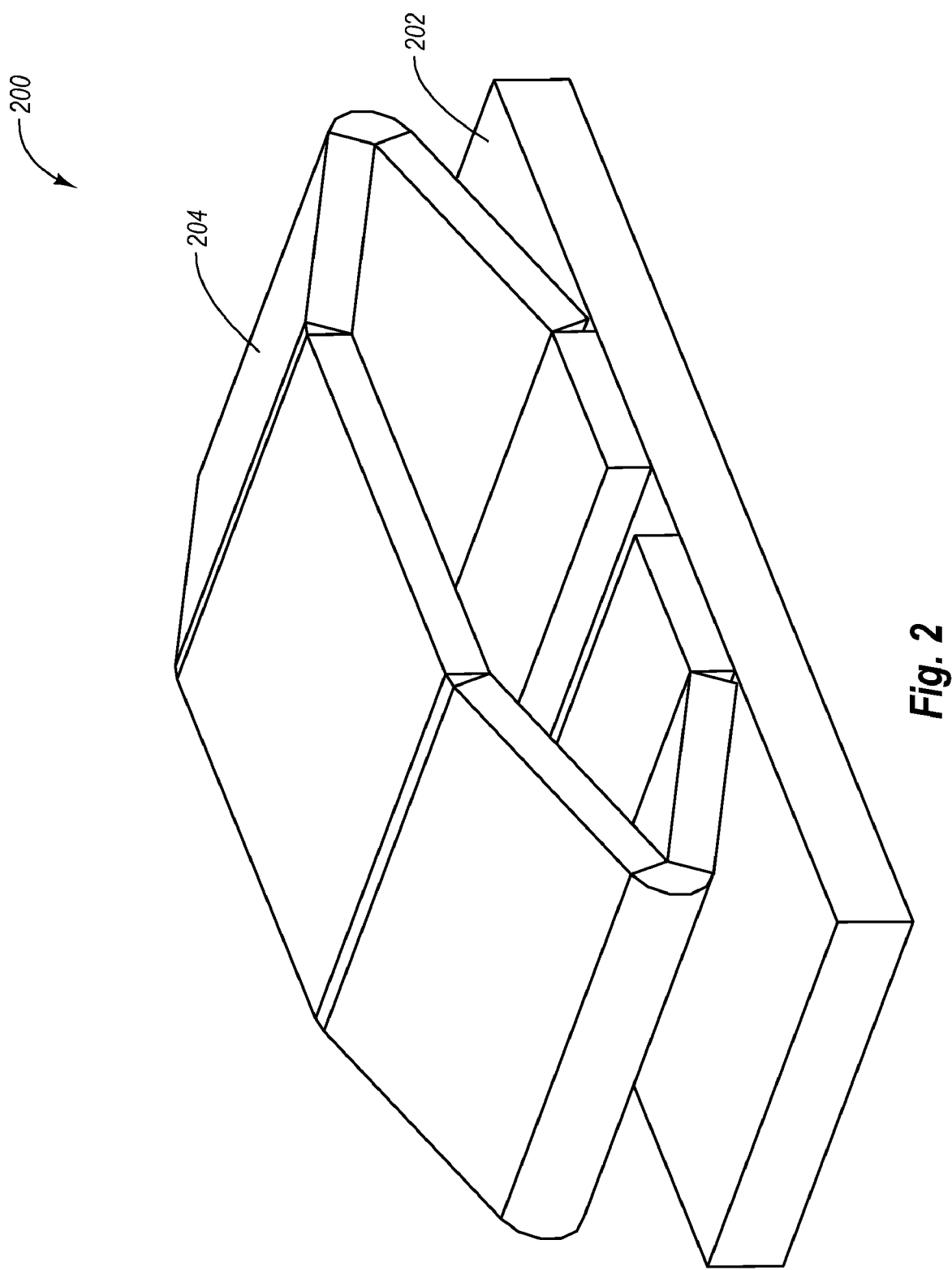
FIG. 2 is a perspective view of an example printed circuit board (PCB) positioning mechanism.

With reference now to FIG. 2, additional aspects of the example PCB positioning mechanism 200 are disclosed. In general, the example PCB positioning mechanism 200 includes a solderable plate 202 and a compressible structure 204 attached to the solderable plate 202. The solderable plate 202 may be formed from any solderable material including, but not limited to, nickel, copper, or tin plated steel. The compressible structure 204 comprises a metal spring.

The example PCB positioning mechanism 200 can utilize surface mount technology (SMT) so that the processes of soldering the example PCB positioning mechanism 200 to the PCB 120 and securing the PCB 120 in the x-direction, y-direction, and z-direction within the optoelectronic transceiver module 100 are completely automated. The example PCB positioning mechanism 200 can be packaged into a tape-and-reel system (similar to the tape-and-reel system 400 disclosed below in connection with FIGS. 4A and 4B) from which they are selected and soldered to the PCB 120 using a pick-and-place system.

The compressible structure 204 of the PCB positioning mechanism 200 is not limited to the diamond shaped metal spring disclosed in FIG. 2, but can be implemented using any solder mountable spring or other spring equivalent that is capable of being both packaged into a tape-and-reel system and being attached to the solderable plate 102 and/or soldered directly to the PCB 120 using a pick-and-place system. Example alternative springs or other spring equivalents include, but are not limited to, coil springs, s-bend springs, compressible polymers on metal, cantilevers, or any other structure(s) of comparable functionality. In addition, the compressible structure 204 can be formed from any combination of compressible elastic materials and/or metals that are capable of being attached to the solderable plate 102 and/or soldered directly to the PCB 120. It is understood, therefore, that the solderable plate 202 may be optional where the compressible structure 204 can itself be soldered directly to the PCB 120.

The example PCB positioning mechanism 200 can enable completely automated positioned and securing of the PCB 120 within the optoelectronic transceiver module 100. The example PCB positioning mechanism 200 can also eliminate the need to secure the PCB 120 with screws or other fasteners, thus decreasing assembly cost, assembly time, and assembly complexity. The example PCB positioning mechanism 200 can also help avoid assembly problems associated with manufacturing tolerances and tolerance stacking between components of the optoelectronic transceiver module 100. For example, the example PCB positioning mechanism 200 can also help avoid assembly problems relating to the thickness of the PCB 120 by taking up any slack between the PCB 120 and the posts 154.

3. Another Example PCB Positioning Mechanism

Figure 3A:
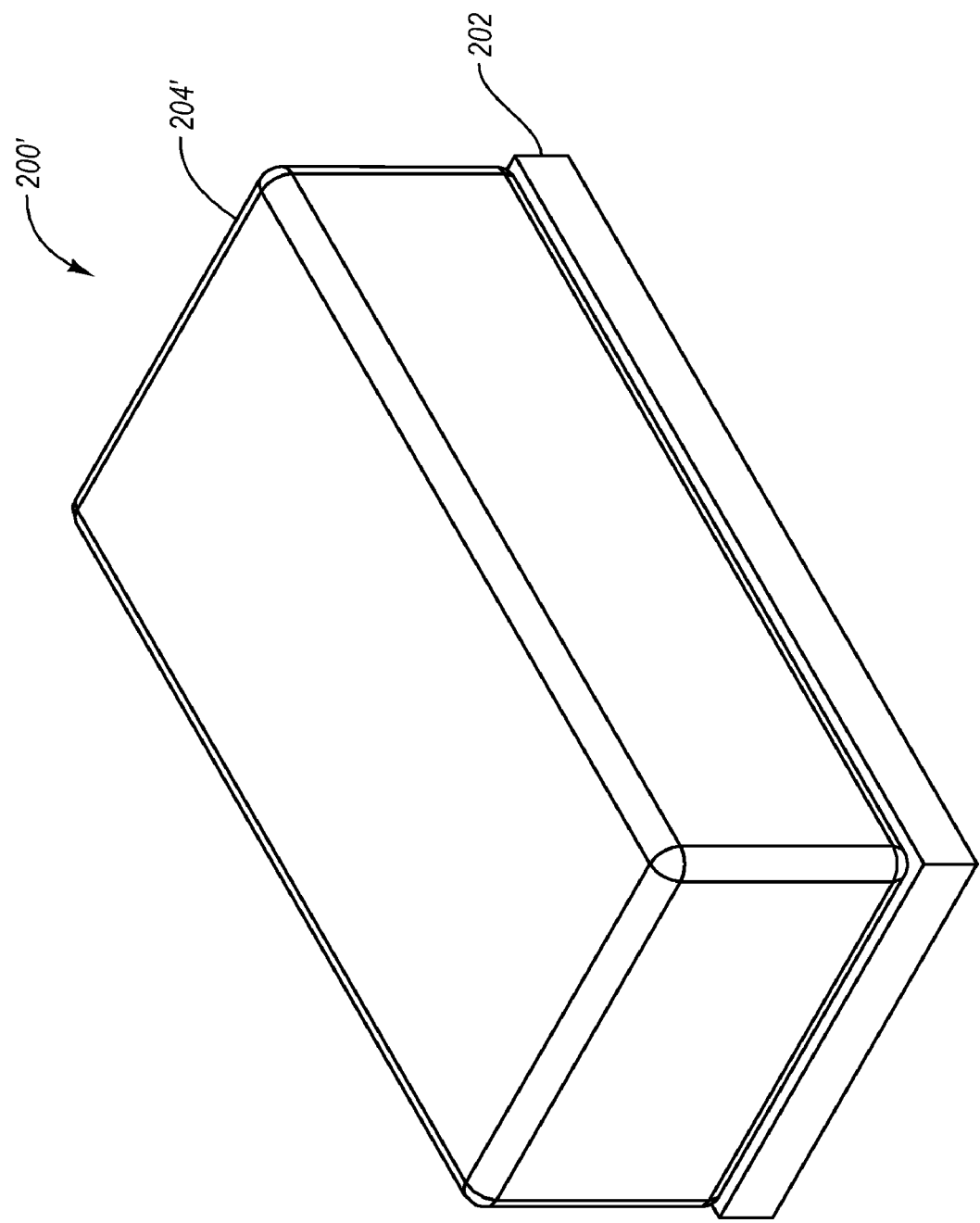
FIG. 3A is a perspective view of another example PCB positioning mechanism.
Figure 3C:
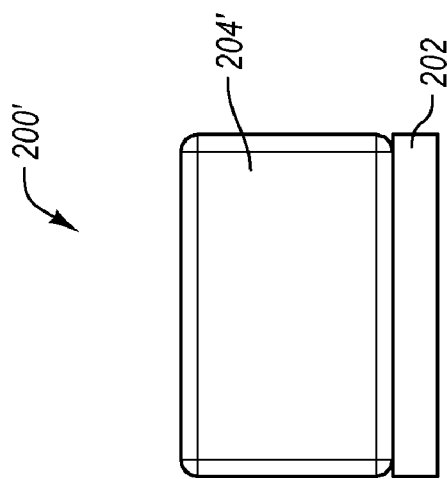
FIG. 3C is a front view of the example PCB positioning mechanism of FIG. 3A in a relaxed state.
Figure 3E:
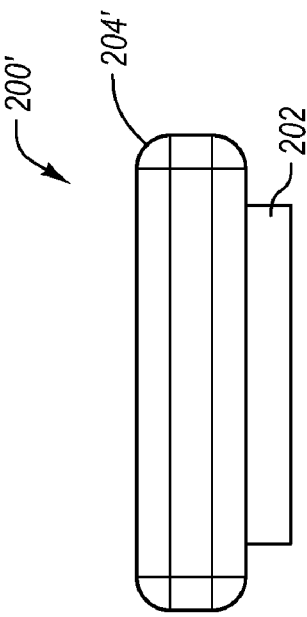
FIG. 3E is a front view of the example PCB positioning mechanism of FIG. 3A in a compressed state.
Figure 3B:
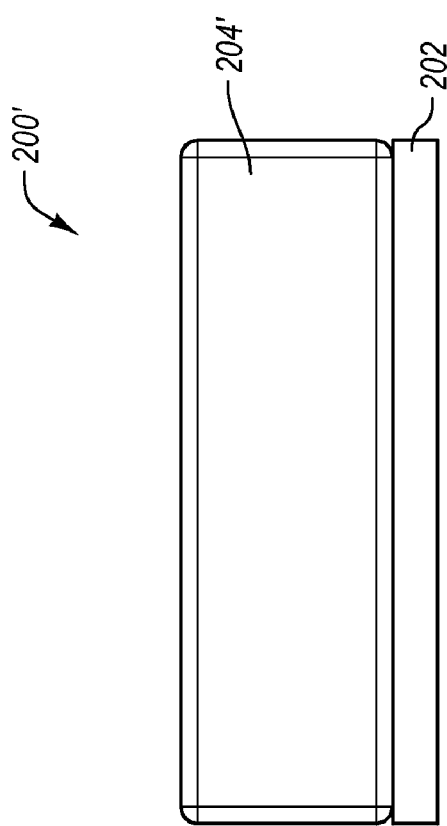
FIG. 3B is a side view of the example PCB positioning mechanism of FIG. 3A in a relaxed state.
Figure 3D:
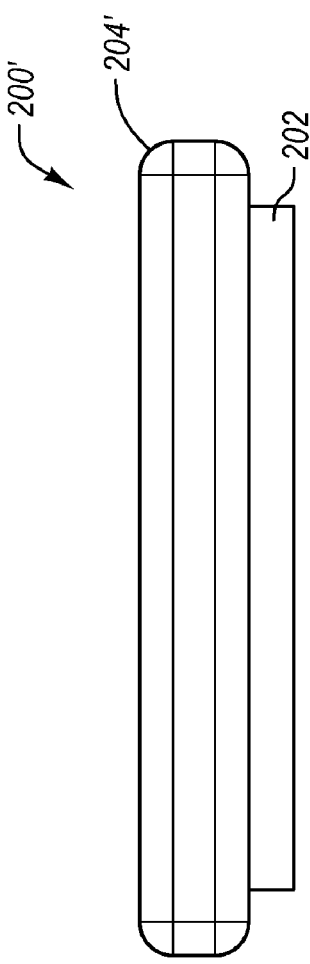
FIG. 3D is a side view of the example PCB positioning mechanism of FIG. 3A in a compressed state.

With reference now to FIGS. 3A-3E, aspects of another example PCB positioning mechanism 200' are disclosed. As disclosed in FIG. 3A, the example PCB positioning mechanism 200' is similar to the example PCB positioning mechanism 200 of FIGS. 1C-2 in that the example PCB positioning mechanism 200' generally includes a solderable plate 202 and a compressible structure 204' attached to the solderable plate 202. However, unlike the compressible structure 204 of FIGS. 1C-2, the compressible structure 204' of FIG. 3A comprises a dielectric silicone rubber. In some example embodiments, the dielectric silicone rubber comprises silicone rubber KE-5620W-U. Being formed from a dielectric enables the compressible structure 204' to be employed to mechanically secure a PCB without causing electrical interference with the electronic circuitry of the PCB. The compressible structure 204' can be formed from other materials having elastic properties and dielectric properties similar to silicone rubber. FIGS. 3B and 3C are side and front views of the example PCB positioning mechanism 200' in a relaxed state. FIGS. 3D and 3E are side and front views of the example PCB positioning mechanism 200' in a compressed state.

4. Example Tape-and-Reel System

With reference now to FIGS. 4A and 4B, aspects of an example tape-and-reel system 300 are disclosed. As disclosed in FIG. 4A, the example tape-and-reel system 300 generally includes a tape 302, perforations 304 defined in the tape 302, and multiple PCB positioning mechanism 200' from FIGS. 3A-3E embedded in the tape 302. The perforations 304 enable the tape 302 to be employed in connection with automated SMT in PCB pick-and-place component stuffing operations.

As disclosed in FIG. 4B, each of the PCB positioning mechanisms 200' in the example tape-and-reel system 300 is embedded in the tape 302 with the solderable plate 202 embedded more deeply than the compressible structure 204'. It is understood that the example tape-and-reel system 300 is not limited to the PCB positioning mechanisms 200', but may instead be used in connection with the PCB positioning mechanisms 200, or any other the PCB positioning mechanism disclosed herein.

In addition to the electronic module environment disclosed herein, the example PCB positioning mechanisms disclosed herein can be employed in any other environment that requires secure positioning of electrical components.

Further, some example PCB positioning mechanisms may be employed using non-solder attachment methods. For example, adhesives may be employed to attach one of the compressible structures disclosed herein to the PCB 120 and/or to the posts 154 defined in the rotatable top shell 104 (see FIG. 1C). Using adhesives may make feasible the positioning of the compressible structure over other electrical elements in the PCB 120, such as traces or vias, without creating an electrical short. Mechanical attachment methods may alternatively be employed. For example, the compressible structure 204, as disclosed in FIG. 2, may include a tab that interlocks with the post 154 of the rotatable top shell 104 (see FIG. 1C) to hold the compressible structure 204 in place.

What is claimed is:

1. A printed circuit board (PCB) positioning mechanism comprising:
 a solderable plate that is attachable to a PCB; and
 a compressible structure attached to the solderable plate such that when the mechanism is attached to the PCB, compression of the compressible structure enables substantial securement of the PCB in a first direction, wherein the compressible structure comprises dielectric silicone rubber or a metal spring.

2. The PCB positioning mechanism as recited in claim 1, wherein the solderable plate comprises nickel.

3. The PCB positioning mechanism as recited in claim 1, wherein the dielectric silicone rubber comprises silicone rubber KE-5620W-U.

4. A tape-and-reel system comprising:
 a perforated tape; and
 a plurality of PCB positioning mechanisms, each of which comprises:
 a solderable plate that is attachable to a PCB; and
 a compressible structure attached to the solderable plate such that when the mechanism is attached to the PCB, compression of the compressible structure enables substantial securement of the PCB in a first direction,
 wherein each of the plurality of PCB positioning mechanisms is embedded in the perforated tape.

5. The tape-and-reel system as recited in claim 4, wherein each of the plurality of PCB positioning mechanisms is embedded in the perforated tape with the solderable plate embedded more deeply than the compressible structure.

6. The tape-and-reel system as recited in claim 4, wherein the tape-and-reel system is substantially compliant with automated solder mount technology such that each of the plurality of PCB positioning mechanisms can be soldered to a PCB using automated PCB pick-and-place component stuffing operations.

7. A PCB system comprising:
 a PCB; and
 a plurality of PCB positioning mechanisms soldered to the PCB, each of the PCB positioning mechanisms comprising:
 a solderable plate; and
 a compressible structure attached to the solderable plate such that compression of the compressible structure enables substantial securement of the PCB in a first direction.

8. The PCB system as recited in claim 7, wherein each solderable plate comprises nickel.

9. The PCB system as recited in claim 7, wherein the compressible structure comprises dielectric silicone rubber.

10. The PCB system as recited in claim 9, wherein the dielectric silicone rubber comprises silicone rubber KE-5620W-U.

11. The PCB system as recited in claim 7, wherein the compressible structure comprises a metal spring.

12. An optoelectronic transceiver module comprising:
   a multi-piece shell, a first piece of the multi-piece shell defining a plurality of posts;
   a PCB at least partially positioned within the multi-piece shell;
   a transmitter optical subassembly (TOSA) electrically connected to the PCB;
   a receiver optical subassembly (ROSA) electrically connected to the PCB; and
   a plurality of PCB positioning mechanisms attached to the PCB, each of the PCB positioning mechanisms comprising:
      a plate; and
      a compressible structure attached to the plate
   wherein each of the plurality of posts corresponds to one of the PCB positioning mechanisms such that when the first piece of the multi-piece shell is engaged with a second piece of the multi-piece shell, each of the plurality of posts compresses a corresponding compressible structure of a PCB positioning mechanism such that the PCB is substantially secured in a first direction within the optoelectronic transceiver module.

13. The optoelectronic transceiver module as recited in claim 12, wherein the plate comprises nickel.

14. The optoelectronic transceiver module as recited in claim 12, wherein the compressible structure comprises dielectric silicone rubber KE-5620W-U.

15. The optoelectronic transceiver module as recited in claim 12, wherein the compressible structure comprises a metal spring.

16. The optoelectronic transceiver module as recited in claim 12, wherein the optoelectronic transceiver module is substantially complaint with the SFP+ MSA.

17. The optoelectronic transceiver module as recited in claim 12, wherein the optoelectronic transceiver module is substantially complaint with the XFP MSA.

18. The optoelectronic transceiver module as recited in claim 12, wherein the plurality of PCB positioning mechanisms comprises four PG positioning mechanisms.

* * * * *

UNITED STATES PATENT AND TRADEMARK OFFICE
CERTIFICATE OF CORRECTION

| | | |
|---|---|---|
| PATENT NO. | : 7,507,034 B2 | Page 1 of 1 |
| APPLICATION NO. | : 12/038708 | |
| DATED | : March 24, 2009 | |
| INVENTOR(S) | : Moore et al. | |

It is certified that error appears in the above-identified patent and that said Letters Patent is hereby corrected as shown below:

Column 8
Line 17 Claim 16, change "complaint" to --compliant--
Line 20 Claim 17, change "complaint" to --compliant--

Signed and Sealed this

Sixteenth Day of February, 2010

David J. Kappos
*Director of the United States Patent and Trademark Office*